United States Patent
Uzoh

[11] Patent Number: 6,066,030
[45] Date of Patent: May 23, 2000

[54] ELECTROETCH AND CHEMICAL MECHANICAL POLISHING EQUIPMENT

[75] Inventor: Cyprian E. Uzoh, Hopewell Junction, N.Y.

[73] Assignee: International Business Machines Corporation, Armonk, N.Y.

[21] Appl. No.: 09/262,691

[22] Filed: Mar. 4, 1999

[51] Int. Cl.[7] .............................. B24B 1/00; B24B 29/00
[52] U.S. Cl. ............................................ 451/41; 451/287
[58] Field of Search ................................ 451/41, 63, 287, 451/288, 289, 397, 398, 54; 156/345, 636.1

[56] References Cited

U.S. PATENT DOCUMENTS

| | | |
|---|---|---|
| 4,435,247 | 3/1984 | Basi et al. . |
| 4,466,218 | 8/1984 | Ottman et al. . |
| 4,527,358 | 7/1985 | Day . |
| 4,549,374 | 10/1985 | Basi et al. . |
| 4,728,552 | 3/1988 | Jensen, Jr. . |
| 4,750,915 | 6/1988 | Tomita et al. . |
| 4,839,005 | 6/1989 | Katsumoto et al. . |
| 4,841,680 | 6/1989 | Hoffstein et al. . |
| 4,842,678 | 6/1989 | Noro et al. . |
| 4,876,224 | 10/1989 | Kusakabe . |
| 4,910,155 | 3/1990 | Cote et al. . |
| 4,934,102 | 6/1990 | Leach et al. . |
| 4,944,119 | 7/1990 | Gill, Jr. et al. . |
| 4,980,036 | 12/1990 | Saito et al. . |
| 5,020,283 | 6/1991 | Tuttle . |
| 5,036,630 | 8/1991 | Kaanta et al. . |
| 5,076,024 | 12/1991 | Akagawa et al. . |
| 5,081,421 | 1/1992 | Miller et al. . |
| 5,108,561 | 4/1992 | Kuromatsu . |
| 5,177,908 | 1/1993 | Tuttle . |
| 5,194,126 | 3/1993 | Packalin . |
| 5,431,766 | 7/1995 | Propst et al. ............................ 156/345 |
| 5,575,706 | 11/1996 | Tsai et al. . |
| 5,643,406 | 7/1997 | Shimomura et al. ................. 156/636.1 |
| 5,660,579 | 8/1997 | Nakayama et al. . |
| 5,807,165 | 9/1998 | Uzoh . |

FOREIGN PATENT DOCUMENTS 284 343 B1   11/1990   European Pat. Off. .

*Primary Examiner*—Rodney A. Butler
*Attorney, Agent, or Firm*—Pollock, Vande Sande & Amernick

[57] ABSTRACT

An apparatus for removing material from a substrate including a single platform comprising elements for performing electroetching and chemical mechanical polishing. A polishing head engages a surface of the substrate to polish the substrate. A cathode for electroetching material from the substrate. A substrate support supports a substrate to be treated. At least one slurry introduction port introduces polishing slurry between the polishing head and the substrate. A power supply supplies power to the anode and the cathode.

47 Claims, 2 Drawing Sheets

ELECTROETCH AND CHEMICAL MECHANICAL POLISHING EQUIPMENT

FIELD OF THE INVENTION

The invention relates to a device and method for removing material from a substrate. In particular, the invention relates to a single apparatus for carrying out chemical mechanical polishing and electroetching. The present invention also includes a method for removing material from a substrate through chemical mechanical polishing and electroetching in a single apparatus.

BACKGROUND OF THE INVENTION

In a variety of applications, material must be removed from a substrate or other workpiece. First, material is deposited on the substrate or workpiece. Portions of the material may then be removed. Sometimes the material may be removed as a part of the normal process. Other times, the material may be removed because it is undesirably deposited in certain locations.

Along these lines, in damascene chip wiring methods, typically material is deposited over all surfaces in a substrate. The material is then polished to leave only material in desired locations. Among the various processes involved in damascene chip wiring methods, apart from the photolithography step, the chemical mechanical polishing typically is the next most expensive step.

Comparatively high cost associated with demascene chip wiring methods and the apparatus utilized in such methods is typically due mostly to lower throughput. Throughput associated with such methods can range from about 3 wafers per hour for levels with relatively wide wire lines, to as high as 8 wafers per hour for thinner metal lines. Typically, for full damascene BEOL, the limited throughput and chemical mechanical polishing typically require additional polishing tools and a subsequent increase in space for the fabrication line to result in a desired level of throughput.

SUMMARY OF THE INVENTION

The present invention addresses these and other problems by providing an apparatus for removing material from the substrate. The apparatus includes a single platform comprising elements for performing electroetching and chemical mechanical polishing. The apparatus also includes a polishing head for engaging the surface of the substrate to polish the substrate. An anode and cathode are included for electroetching material from the substrate. The apparatus also includes a substrate support for supporting the substrate for as much material is to be removed. At least one slurry introduction port is provided for introducing polishing slurry between the polishing head and the substrate. A power supply supplies power to the anode and the cathode.

Additionally, the present invention provides a method for removing material from the substrate. According to the method, a substrate is introduced into an apparatus that includes a single platform comprising elements for performing electroetching and chemical mechanical polishing. Chemical mechanical polishing is performed on the substrate. Electroetching is also performed in the substrate without transferring the substrate to another apparatus.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

As a way to reduce costs and increase throughput in semiconductor production methods, the present invention provides an apparatus that includes elements for carrying out at least two of the following processes including chemical mechanical polishing (CMP), electroetching and metal chemical etching. While the present invention may include tools for carrying out at least two of these processes in different chambers, the tools are all on the same platform. According to one embodiment, an apparatus according to the present invention includes a tool that includes elements for performing electroetching and chemical mechanical polishing.

In a metal chemical etch chamber, or wet etch chamber, a high metal dissolution rate of several microns per minute may be utilized to reduce most of the initial overburden of deposited metal. The final planarization step may be accomplished by chemical mechanical polishing in an adjacent chamber.

By combining these apparatuses into a single tool according to the present invention, it has been found that the throughput of the planarization step may be increased by a factor of about 1½ to about 2. In the past, to increase throughput, more chemical mechanical polishing tools were utilized or polishers were utilized that included multiple polishing heads.

Figure 1:
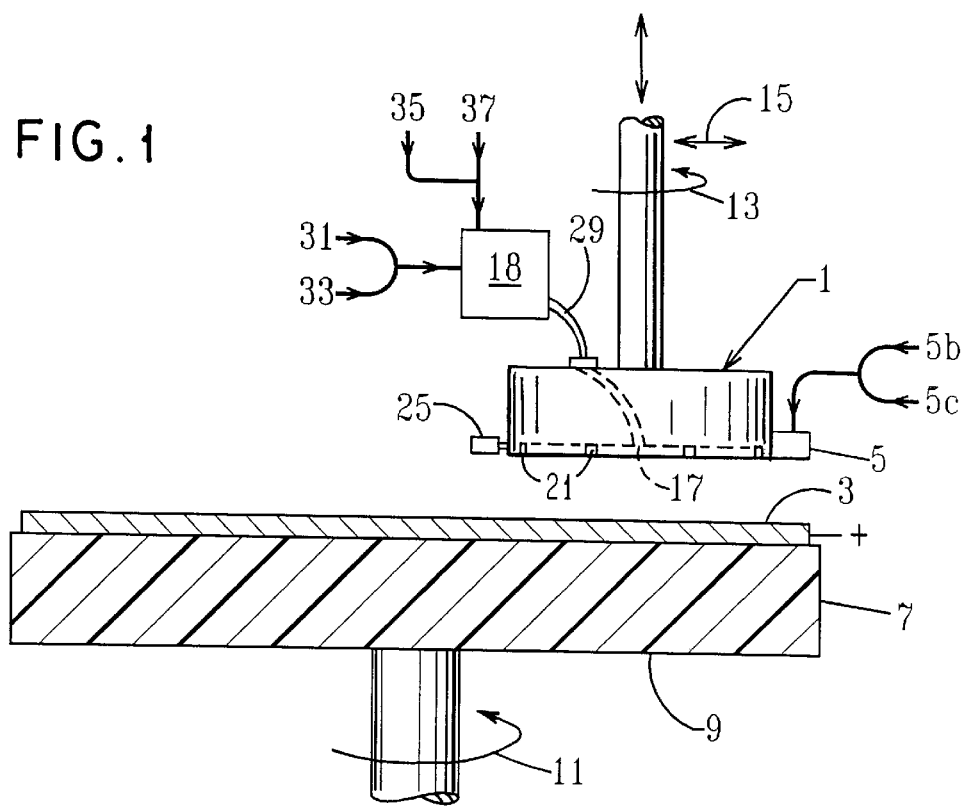
FIG. 1 represents a cross-sectional view of an embodiment of an apparatus according to the present invention for carrying out at least chemical mechanical polishing and electroetching of a substrate.

FIG. 1 illustrates an embodiment of a device according to the present invention. The embodiment illustrated in FIG. 1 may be utilized for carrying out both chemical mechanical polishing and electroetching of a substrate. Along these lines, the embodiment illustrated in FIG. 1 includes a polishing head 1 for carrying chemical mechanical polishing on a substrate 3. The polishing head may include a pad region illustrated in FIG. 2 and discussed below in greater detail.

The apparatus illustrated in FIG. 1 also includes an anode 3 and cathode 5 for electroetching material from the substrate. The cathode 5 may be arranged adjacent the polishing head while the anode 7 typically the workpiece, may be provided in contact with the rotating platen 9. Or the substrate may simply form the cathode. The present invention may include a power supply for supplying power to the anode or workpiece and the cathode.

The substrate 3 or the anode may be supported on substrate support 9. The workpiece 3 may be energized to serve as an anode. To enhance the evenness and speed of the chemical mechanical polishing and other processes, the substrate support 9 may rotate as indicated by arrow 11.

As stated above, the present invention may also include elements for carrying out chemical mechanical polishing. These elements can include a polishing head. FIG. 1 illustrates an embodiment of a polishing head 1. As indicated by arrows 13 and 15, the polishing head may be rotated as well as having its position altered in a lateral direction. Also, position of the head may be vertically altered, to move away from the substrate or downward to increase polishing pressure on the workpiece.

While the polishing head and/or the substrate support may both rotate, it is not necessary that either rotate. Also, while the substrate support rotates, the head 1 may transverse laterally as during etching operations. Lateral movement of the head may also take place without the substrate rotating.

Polishing slurry may be introduced between the polishing head and the substrate to be polished through at least one slurry introduction orifice or port 17 provided on the polishing head. The at least one slurry port 17 may be connected to a supply of polishing slurry 18 as discussed in greater detail below.

Figure 2:
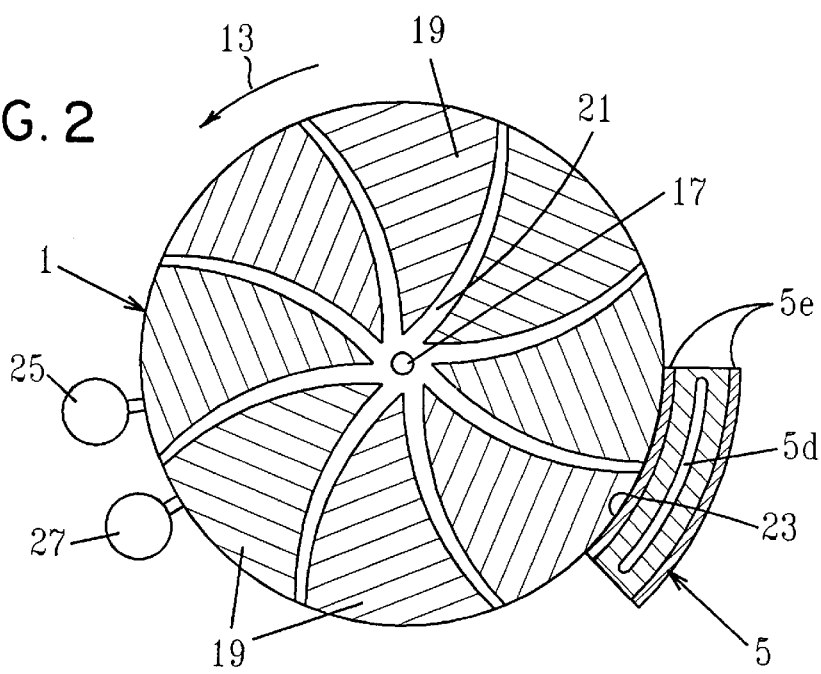
FIG. 2 represents an overhead view of an embodiment of a polishing head according to the present invention.

FIG. 2 illustrates a front view of the polishing head illustrated in cross-sectional view in FIG. 1. The embodiment of the polishing head illustrated in FIG. 2 includes a pad region 19. The pad region includes surfaces that will actually engage the surface of the substrate being polished.

To enhance distribution of slurry throughout the region between the polishing head and the substrate, the polishing head may include at least one slurry distribution gap or runner 21. The embodiment illustrated in FIG. 2 includes a plurality of slurry distribution gaps or channels.

To enhance the distribution of slurry further, the slurry distribution gap(s) may have a shape to encourage the slurry(ies) to be distributed throughout the space between the polishing head and the substrate. The embodiment of the slurry distribution gap illustrated in FIG. 2 includes a curved shape that radiates in a curve away from a central region of the polishing head. FIG. 2 also illustrates the slurry introduction port 17.

FIG. 2 also illustrates the cathode 5 illustrated in cross-section in FIG. 1. As illustrated in FIGS. 1 and 2, the cathode may be arranged in the vicinity of and/or adjacent the polishing head 1. As illustrated in FIGS. 1 and 2, the cathode may be arranged adjacent a side wall of the polishing head.

As illustrated in FIG. 2, the cathode 5 may include a surface 23 having a shape complimentary to the contour of the shape of the side wall of the polishing head 1. Including a cathode having a complimentary shape to the exterior surface of the side wall of the polishing head can help to increase the surface area contact between the cathode and the polishing head where the cathode contacts the polishing head. As illustrated in FIG. 2, the entire cathode 5 may have a shape complimentary to the shape of the side wall of the polishing head 1.

Also, the cathode may be removable. Whether removable or not, the cathode may be located about 2 to 3 mm from the walls of the polishing head. An easily detachable cathode may be fabricated from stainless steel or titanium or other suitable materials. As seen in FIG. 2, the cathode may include inlets 5b and 5c for at least one etching or polishing solution. The cathode may also include channel 5d for outlet or discharge of the etching or electropolishing solution on the workpiece 3.

For electrolyte etching or polishing operations, the electrolyte or electrolytes may be pumped through the inlets 5b and 5c, shown in FIG. 1, of the cathode at a flow rate of about 0.5 liters per minute to about 10 liters per minute. As the electrolyte(s) flow(s), the cathode material 5f, illustrated in FIG. 2a, may be rendered cathodic, with voltage that may range between about 1 volt and about 10 volts. Along these lines, the cathode assembly may include an electrical connection 5g to a power supply.

Figure 2A:
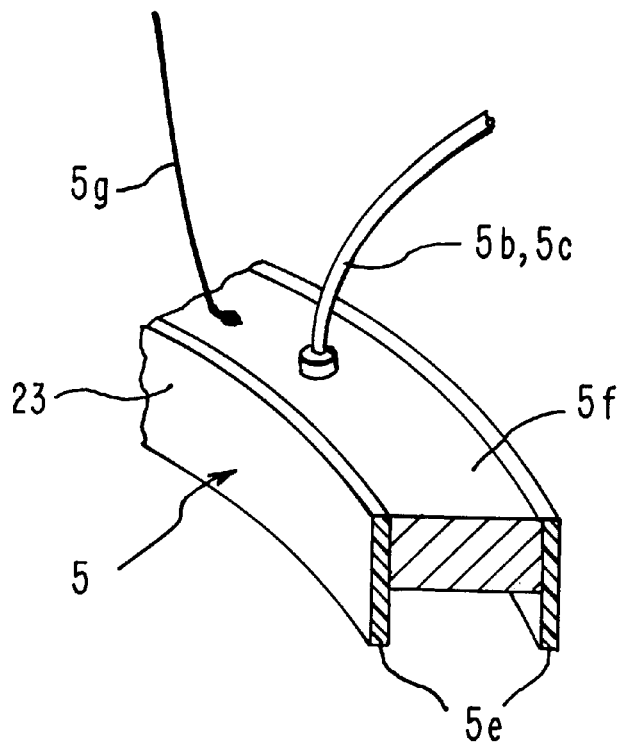
FIG. 2a represents a perspective and cross-sectional view of a portion of an embodiment of a cathode assembly according to the present invention.

The cathode assembly may include a dam wall 5e, shown in FIG. 2a. The dam wall may help maintain a liquid gap of about 1 mm to about 5 mm between the cathode material 5f and the workpiece 3. Also, the dam wall may be fabricated from an insulating material. One example of an insulating material that may be utilized in the dam wall 5e is high density polypropylene. Of course, any suitable insulating material may be utilized in the dam wall.

The dam wall 5e may also act as a wave guide. As such, the dam wall 5e may direct the electric field to the workpiece. The dam wall 5e may also shield the workpiece region not immediately below the cathode material 5f from dissolution.

During the electroetching or polishing step, the substrate holder 9 may rotate the workpiece 3 at a rate of about 5 revolutions per minute to about 50 revolutions per minute. Also during the electroetching or polishing step, the head 1 may move laterally across the workpiece at a speed that may range between about 0.3 centimeters per second to about 3 centimeters per second.

The present invention may include a sensor 25 for measuring the amount of material removed or left on the workpiece by the scanning cathode 5, as the cathode travels across the workpiece. The rate of material removal from the workpiece may range from about 0.05 microns per second to about 1.5 microns per second.

After the material removal operation, the workpiece may momentarily rinsed with deionized water (DI). The DI may be pumped through inlet 5c of the cathode assembly. The time for this brief rinse cycle may range between about 2 seconds to about 5 seconds. During the rinse, the substrate may be rotated at a rate of about 60 rpm to about 300 rpm. During the rinse cycle, the head 1 may retract upwards away from the workpiece about 2 cm to about 5 cm.

After the rinse step, if included, the chemical mechanical planarization (CMP) of the remain metal on the workpiece 3 may be initiated. If no rinse is carried out, the CMP may be carried out after the electroetch.

Also arranged adjacent to the polishing head 1 may be at least one sensor 25. The sensor(s) may vary, depending upon the processes carried out. For processing metals, an eddy current probe may be used to measure the amount of metal left on the workpiece. For insulator polishing, an ellipsometric sensor may be used to measure the amount of insulator left on the workpiece.

Another example of a sensor utilizes a UV visible fiber optic array to detect the presence of certain reaction compounds or by products. By detecting these materials, the sensor may detect end points during CMP operations. A UV sensor may be utilized in a reflector mode to detect various materials since UV light typically is reflected differently by different materials, and particularly different metals.

Further arranged adjacent to the polishing head may be at least one second sensor 27 to detect a polishing end point. For example, the end point detector could be an electrochemical sensor calibrated to detect the transition of one type of material to another. For example, the at least one sensor could include a pH sensor. Such a sensor could detect changing conditions as a change occurs from one chemical reaction to another.

Typically, sensor 25 and 27 operate in a collaborative manner. For instance, sensor 25 may initially quickly measure the thickness and profile of material such as metal deposited on the workpiece. From this information, the sensor may select the optimum recipe of electropolishing and/or CMP processes required.

After electropolishing and/or CMP processes are initiated, toward a later part of the CMP process, sensor 25 may activate sensor 27. With both sensors activated, they may both work in a collaborative manner. For example, in the polishing of copper films with a tantalum barrier layer in a damascene type structure, sensor 25 may control the initial portions of Cu electroetching and CMP overburden removal. As the amount of metal left, for example, is reduced to about 50 nm to about 100 nm, sensor 27 may be activated. A higher sensitivity of sensor 27 may enhance endpoint detection, on the titanium barrier layer, while sensor 25 may measure the thickness of the barrier material needed to be removed.

Sensor 25 may initiate an appropriate choice of recipe for barrier removal and may activate flow of barrier slurry through inlet 5c. On the other hand, sensor 27 may determine titanium barrier endpoint and may initiate a rinse recipe. The rinse could be initiated to clean off all slurry from the workpiece. The rinse could be pumped through chamber 18. The workpiece may then be spun dry and unloaded.

As stated above, at least one slurry may be introduced through at least one slurry port 17. The slurry(ies) may be contained in at least one slurry reservoir 18 or be fed into slurry reservoir from slurry sources. The slurry reservoir 18 may be connected to slurry port 17 through slurry conduit 29. The embodiment illustrated in FIG. 1 includes two slurry sources 31 and 33 for introducing two different slurries into slurry reservoir 18.

To enhance the action of the slurries in the chemical mechanical polishing, nitrogen and/or oxygen, ammonia or $CO_2$ may be introduced into the slurry(ies). Oxygen and nitrogen may effect the polishing rate as well as the degree of smoothness of the polishing. The nitrogen and/or oxygen may be introduced into the slurry(ies) at any point prior to introduction of the slurry(ies) into slurry reservoir 19 or introduction into the space between the polishing head and the substrate.

Accordingly, the present invention may include a source of nitrogen 35 and a source of oxygen 37. The nitrogen may be in the form of $N_2$, while the oxygen may be in the form of $O_2$. The oxygen may also be introduced in the form of inorganic or organic peroxides or iodates. Any source of nitrogen or oxygen may be utilized, including any nitrogen or oxygen containing compound.

For example, to generate a move aggressive slurry, oxygen may be introduced into chamber 18. The oxygen flow rate may range from about 5 sccm/L of slurry to about 100 sccm/L of slurry in the slurry mix chamber 18.

For some metals, the metal removed rate may be higher when the metal is oxidized. For example, nitric acid could be utilized to oxidize the metal. The introduction of higher concentration of oxygen into the slurry may enhance metal removed rate. However, this enhanced removed rate, while highly beneficial when there is large metal overburden, could produce disastrous results with respect to metal removal endpoint. This is because the material insides the trenches and vias may be removed where such removal is not desired.

Prior to the endpoint of metal removal, $N_2$ may be sequentially introduced into the slurry to displace the more aggressive oxygen introduced earlier in the process. The presence of $N_2$ in the slurry may reduce the aggressiveness of the slurry and help produced a highly smooth and reflective finish on the end product. The flow rate of $N_2$ may range between about 10 sccm/L of slurry to about 500 sccm/L of slurry in chamber 18.

Also, chamber 18 may be equipped with flow control values to control slurry delivery through channel 17. Additionally, chamber 18 may include a coarse filter for filtering particles having dimensions of about 1 to about 30 microns to remove undesirable particles from the slurry.

In some slurry systems, sensor 27 may detect pH changes. The pH may change during the CMP process. The pH change typically is due to by-products of the reactions taking place. The change in pH may degrade the polishing rate and the nature of the finish on the end product. For such systems, the introduction of $CO_2$ or $NH_3$ gas may be used to control the pH insitu on the polishing pad. The flow rate of $CO_2$ may range between about 3 sccm/L of slurry to about 20 sccm/L of slurry.

The judicious combination of $O_2$, $N_2$, $CO_2$, $NH_3$ and/or other gases may be used to enhance the polishing of Cu, Al, W, Ta, Ti, TiN, Cr, Au, Ag, Ni, $SiO_2$, SiN, $SiO_xN_y$, amorphous metal, ferromagnetic films, such as parmalloy, high dielectric constant materials, such as with a dielectric constant greater than about 9, and lower dielectric constant materials, such as with dielectric constant lower than about 3 to about 5.

The slurries may be formulated to carry out the CMP at various rates. The insitu slurry formulation could be carried out to process at a slow rate, medium rate, and fast rate, sequentially or in any desirable combination.

The present invention may utilize a dynamic loop for controlling formulation of the slurry(ies) and control of the polishing process. The dynamic control loop is an alternative to manually controlling the polishing slurry formulation and polishing process. The various sensors described herein may be utilized to sense slurry conditions as well as condition of the substrate and stage of material removal. The sensors may act cooperatively to control the process. The sensors may also act adaptively, for control of the process without an operator. The control loop and utilization of the sensors may apply to the electroetching process as well.

In addition, the chamber 18 may contains heating elements to help maintain the formulation slurry at optimum temperature to prevent particulate agglomeration.

As stated above, the present invention also provides a method for removing material from a substrate. The method includes introducing a substrate into an apparatus such as that described above. Chemical mechanical polishing is performed on the substrate and electroetching is performed on the substrate without transferring the substrate to another apparatus.

One of shortcoming of traditional methods of polishing wafers is that the substrate faces down on a pad. Enhancing slurry transport to the substrate requires that the platen typically is several times larger than the substrate. The slurry is typically dispensed on the pad close to the substrate as the platen and/or the substrate rotates. Various complicated substrate motions, such as orbital or planetary motions, are often required to help ensure that flesh slurry reaches the center of the substrate.

According to the present invention, the slurry may be metered through the center of the polishing head. To further enhance fresh slurry distribution, the pads instead of being flat and continuous may be shaped and discontinuous. Fresh solution may be transferred to different regions of the pad through the gaps 21, or runners, separating the various pad elements 19.

The shaped runners may be designed for optimum slurry dispersal to various parts of the pad. For example, the runners 21 may be wider in the vicinity of the center of the pad and narrower in the vicinity of the periphery of the pad. The narrowest section may occur in the vicinity of the edge of the pad. This design may not only enhance slurry flow and dispersal throughout the head, but it may also maximize slurry retention times over the head. The latter aspect may reduce amount of slurry needed to polish a given substrate.

Figure 3:
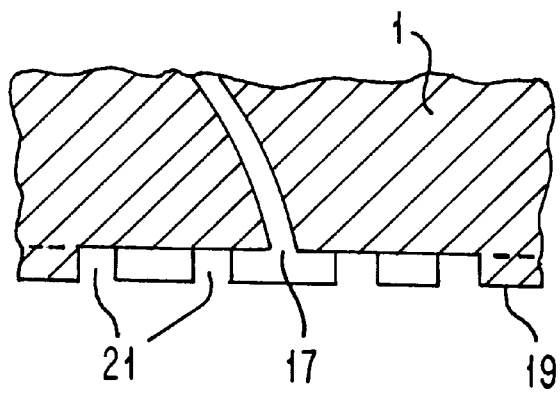
FIG. 3 represents a cross-sectional view of a portion of an embodiment of a polishing head according to the present invention.

FIG. 3 illustrates a cross-sectional view of a portion of the polishing head illustrated in FIG. 2. As such, FIG. 3 illustrates pad region 19, slurry distribution gaps 21, and slurry orifice 17, all included on polishing head 1.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

I claim:

1. An apparatus for removing material from a substrate, comprising:
   a single platform comprising elements for performing electroetching and chemical mechanical polishing;
   a polishing head for engaging a surface of the substrate to polish the substrate;
   a cathode for electroetching material from the substrate;
   a substrate support;
   at least one slurry introduction orifice for introducing polishing slurry between the polishing head and the substrate; and
   a power supply for supplying power to an anode and the cathode.

2. The apparatus according to claim 1, wherein the single platform further comprises a chamber for metal chemical etching.

3. The apparatus according to claim 1, wherein the substrate provides an anode.

4. The apparatus according to claim 1, further comprising:
   at least one source of at least one material selected from the group consisting of $O_2$, $N_2$, $NH_3$ and $CO_2$ for injecting at least one of $O_2$ and $N_2$ into a slurry for the electroetching or chemical mechanical polishing.

5. The apparatus according to claim 1, wherein the at least one slurry is formulated insitu.

6. The apparatus according to claim 1, further comprising:
   a plurality of slurries for carrying out the chemical mechanical polishing at various rates.

7. The apparatus according to claim 1, wherein the cathode has a curved shape complementary to a side wall of the polishing head, wherein the cathode is arranged adjacent the side wall of the polishing head, wherein the substrate support includes the anode, wherein the workpiece is arranged on the substrate support.

8. The apparatus according to claim 1, wherein the cathode is arranged adjacent a side wall of the polishing head, wherein the pad includes radial slurry distribution gaps, wherein the substrate support includes the cathode, wherein the workpiece is arranged on the substrate support.

9. The apparatus according to claim 1, further comprising:
   at least one sensor for sensing at least one of a condition of the substrate and a condition of a material being utilized to remove material from the substrate.

10. The apparatus according to claim 1, further comprising:
    a plurality of slurry introduction orifices.

11. The apparatus according to claim 1, wherein at least one of the polishing head and the substrate support rotates.

12. The apparatus according to claim 1, further comprising:
    a dynamic control loop for carrying out control of at least one of the electroetching and chemical mechanical polishing.

13. The apparatus according to claim 1, further comprising:
    means for sequentially controlling a rate of chemical mechanical polishing.

14. The apparatus according to claim 8, wherein the anode has a curved shape complementary to the side wall of the polishing head.

15. The apparatus according to claim 8, wherein the radial slurry distribution gaps radiate in a curve away from a central region of the polishing head.

16. The apparatus according to claim 8, further comprising:
    an end point sensor for sensing a desired ending position of the material removal.

17. The apparatus according to claim 9, wherein the at least one sensor is an end point sensor for sensing a desired ending position of the material removal.

18. The apparatus according to claim 9, wherein the at least one sensor is selected from the group consisting of a pH sensor, an electrochemical sensor, a sensor that utilizes a UV visible fiber optic array, an eddy current sensor, and an ellipsometric sensor.

19. The apparatus according to claim 17, wherein the control loop controls formulation of polishing slurries and the chemical mechanical polishing process.

20. The apparatus according to claim 19, wherein the rate of chemical mechanical polishing is controlled by varying composition of a polishing slurry.

21. The apparatus according to claim 19, wherein the rate varies from fast to moderate to slow.

22. A method for removing material from a substrate, the method comprising:
    introducing the substrate into an apparatus that includes a single platform comprising elements for performing electroetching and chemical mechanical polishing;
    performing chemical mechanical polishing on the substrate; and performing electroetching on the substrate without transferring the substrate to another apparatus.

23. The method according to claim 22, further comprising:

providing the apparatus with a polishing head for engaging a surface of the substrate to polish the substrate, a cathode for electroetching material from the substrate, a substrate support, at least one slurry introduction orifice for introducing polishing slurry between the polishing head and the substrate, and a power supply for supplying power to an anode and the cathode.

24. The method according to claim 23, further comprising:

providing the apparatus with a chamber for metal etch on the single platform; and performing metal etch on the substrate.

25. The method according to claim 23, further comprising:

injecting at least one member selected from the group consisting of $O_2$, $N_2$, $CO_2$ and $NH_3$ into a slurry for the electroetching or chemical mechanical polishing.

26. The method according to claim 23, further comprising:

introducing a plurality of slurries for carrying out the chemical mechanical polishing at various rates into the apparatus.

27. The method according to claim 22, further comprising:

formulating at least one chemical mechanical polishing slurry insitu.

28. The method according to claim 23, further comprising:

providing the cathode with a curved shape complementary to a side wall of the polishing head;

arranging the cathode adjacent the side wall of the polishing head;

providing the substrate support with the anode; and arranging the substrate on the substrate support.

29. The method according to claim 23, further comprising:

arranging the cathode adjacent a side wall of the polishing head;

providing the pad with radial slurry distribution gaps;

providing the substrate support with the cathode; and arranging the substrate on the substrate support.

30. The method according to claim 23, further comprising:

providing the apparatus with a plurality of slurry introduction orifices.

31. The method according to claim 23, further comprising:

rotating at least one of the polishing head and the substrate support.

32. The method according to claim 23, further comprising:

sensing eddy currents in the anode.

33. The method according to claim 23, further comprising:

sensing pH of at least one of an electrolyte utilized in electroetching and a polishing slurry utilized in chemical mechanical polishing.

34. The method according to claim 23, further comprising:

sequentially controlling a rate of chemical mechanical polishing.

35. The method according to claim 23, further comprising:

providing the apparatus with a dynamic control loop for carrying out control of at least one of the electroetching and chemical mechanical polishing.

36. The method according to claim 23, further comprising:

providing the apparatus with a chemical mechanical polishing head that includes a shaped pad and shaped slurry runners.

37. The method according to claim 23, further comprising:

providing the apparatus with at least one sensor.

38. The method according to claim 23, further comprising:

providing the apparatus with at least one sensor for sensing at least one of a condition of the substrate and a condition of a material being utilized to remove material from the substrate.

39. The method according to claim 29, further comprising:

providing the cathode with a curved shape complementary to the side wall of the polishing head.

40. The method according to claim 20, further comprising:

sensing the desired ending position of the material removal.

41. The method according to claim 29, further comprising:

providing the radial slurry distribution gaps such that they radiate in a curve away from a central region of the polishing head.

42. The method according to claim 34, wherein the rate of chemical mechanical polishing is controlled by varying composition of a polishing slurry.

43. The method according to claim 34, wherein the rate varies from fast to moderate to slow.

44. The method according to claim 35, wherein the control loop controls formulation of polishing slurries and the chemical mechanical polishing process.

45. The method according to claim 37, wherein the apparatus is provided with a plurality of sensors including cooperative sensors and adaptive sensors.

46. The method according to claim 45, wherein the at least one sensor is an end point sensor for sensing a desired ending position of the material removal.

47. The method according to claim 45, wherein the at least one sensor is selected from the group consisting of a pH sensor, an electrochemical sensor, a sensor that utilizes a UV visible fiber optic array, an eddy current sensor, and an ellipsometric sensor.

* * * * *